United States Patent [19]

Hortaleza et al.

[11] Patent Number: 6,089,443
[45] Date of Patent: Jul. 18, 2000

[54] BALANCING OF X AND Y AXIS BONDING BY 45 DEGREE CAPILLARY POSITIONING

[75] Inventors: Edgardo R. Hortaleza; Willmar E. Subido, both of Garland, Tex.

[73] Assignee: Texas Instruments Incorporated, Dallas, Tex.

[21] Appl. No.: 09/178,820

[22] Filed: Oct. 26, 1998

Related U.S. Application Data

[60] Provisional application No. 60/063,856, Oct. 31, 1997.
[51] Int. Cl.[7] .............................. B23K 31/02; B23K 37/04
[52] U.S. Cl. ........................ 228/180.5; 228/4.5; 228/49.1
[58] Field of Search ................................. 228/4.5, 180.5, 228/102, 49.1; 219/56.21, 56.22; 257/784, 786

[56] References Cited

U.S. PATENT DOCUMENTS 5,544,804   8/1996   Test et al. ............................. 228/180.5

*Primary Examiner*—Patrick Ryan
*Assistant Examiner*—Colleen Cooke
*Attorney, Agent, or Firm*—Wade James Brady, III; Frederick J. Telecky, Jr.

[57] ABSTRACT

A method of bonding wire and the bonder which includes providing a wire bonder for bonding wire to a bonding location. The wire bonder has a first bonding head designed to form a stitch bond while travelling in a first predetermined direction, the first bonding head having a first major axis and a first minor axis normal to the first major axis, the first major axis being at an angle of from about 45 degrees to a finite angle greater than zero relative to the first predetermined direction and a second bonding head designed to form a stitch bond while travelling in a second predetermined direction, the second bonding head having a second major axis and a second minor axis normal to the second major axis, the second major axis being at an angle of from about 45 degrees to a finite angle greater than zero relative to the second predetermined direction. An area having bonding locations to which the bonder is to make wire bonds is divided into a plurality of regions. Then the first bonding head is caused to make wire bonds in a predetermined one of the plurality of regions and the second bonding head is caused to make wire bonds in a predetermined second one of the plurality of regions. The first major axis is preferably at an angle of about 45 degrees with respect to the first predetermined direction and the second major axis is preferably at an angle of about 45 degrees with respect to the second predetermined direction. The first predetermined direction is preferably substantially normal to the second predetermined direction.

4 Claims, 1 Drawing Sheet

BALANCING OF X AND Y AXIS BONDING BY 45 DEGREE CAPILLARY POSITIONING

This application claims priority under 35 USC 119(e)(1) of provisional application No. 60/063,856 filed Oct. 31, 1997.

BACKGROUND OF THE INVENTION

1. Field of the Invention

This invention relates to wire bonders and capillary or bond head orientation with respect to each other.

2. Brief Description of the Prior Art

In the fabrication of semiconductor devices, wiring between two bond pads on a chip or between a bond pad on the chip and an external bonding location, such as a lead frame, is generally performed by making a ball bond on one bonding pad at one end of a wire fed from a spool and then making a stitch bond at the other end of the wire. The wire is also severed from the spool from which it has been fed at the stitch bond location. Such bonding and wire severing is generally performed with the aid of a capillary through which the wire to be bonded is passed from the wire spool. The procedure is to form a ball from a portion of the wire which extends out of the capillary, bond the ball to a bond pad and move the capillary to the bonding location with the wire being fed out through the capillary during travel of the capillary to the second bonding location. The wire is then stitch bonded at the second location, usually a lead finger, and prepared for severing from the spool, using the nose of the capillary to perform the stitch bonding task.

In order for the capillary to perform the function of stitch bonding, the capillary must apply a force against the wire which rests on the bonding location with the nose or terminal portion thereof. In order to perform this task without fracture of the capillary, as a first condition, the capillary wall must have sufficient thickness to withstand the forces applied thereto at the location of force application during the stitch bonding procedure.

This has been accomplished in the prior art by providing a wire bonding capillary with central bore or aperture, a circular cross section and wall thickness from exterior surface to central bore sufficient to accomplish the above described purpose and withstand the expected maximum forces thereon.

With the continual decrease in the spacing dimensions between wire bonding locations, particularly in the semiconductor art, the problem of bonding wire to a wire bonding surface with a capillary and then moving the capillary to a new location without interfering with adjacent wire bonding locations and wires bonded at adjacent wire bonding locations has increased. As the dimensions decrease, the possibility that the capillary will interfere with or strike an adjacent bond pad or wire extending from an adjacent bond pad in its travel from one bonding location to a second bonding location increases.

A prior art technique that has been developed to accommodate and/or minimize this problem has utilized a wire bonding capillary of circular cross section with a portion of the capillary wall on a pair of opposing sides of the capillary removed to provide an indentation or flattening thereat. Capillaries of this type are provided by Texas Instruments Incorporated under the trademark BowTI™. This is accomplished by using a capillary having a nose or stitch face somewhat in the shape of a figure "8" with a hollow center to carry the wire as in the prior art and with a thin walled waist region. The thin wall portion of the figure "8" can be escalloped or a pair of flat parallel surfaces. A capillary with this shape is still capable of performing the functions of forming and bonding the ball from the wire passing therethrough at a bond pad and then stitch bonding the wire at a bond location, using the thicker-walled portion of the figure "8"-shaped capillary. The top and bottom portions of the figure "8" must be used to make the stitch bond because they are thicker and better capable of withstanding the forces applied to the capillary during stitch bonding. With a capillary having the above described shape, when bonds are to be made concurrently at adjacent bond location, the adjacent bonds are made with the capillaries rotated by 90° relative to each other so that the circular or flattened waist portion of one capillary fits into but is separated from the waist portion of the adjacent capillary. As is apparent, the bond spacing can be materially decreased with the above described technique. After ball bonding one end of the wire extending from the capillary, the capillary with wire therein is moved in either an x-direction or a y-direction or both to the next bonding location during which time the wire is passed through the capillary. The other end of the wire just bonded is then stitch bonded at the next bonding location using the thicker portions of the capillary to make the stitch bond with the capillary moving in only one of the x- or y direction and in the direction of its major axis when making the stitch bond so that the thick portion of the nose of the capillary forms the stitch bond.

A problem that arises in the use of the above described figure "8" shaped capillary is that the capillary is capable of performing a bond along only one axis due to its rigidity along the major axis and fragility along the minor axis or waist of the figure "8". For this reason, for an area of coverage, the wire bonders require two bond heads or capillaries, one for operation in the x-direction and one for operation in the y-direction. However, when the device being fabricated requires that more bonds be made in one of the x or y directions relative to the other, such as, for example, when the semiconductor die is rectangular and not square, the time required for completion of the bonding operation is extended. This is a result of the fact that one of the bonding heads must make more bonds than the other, leaving one bonding head idle while the other continues to be operated.

SUMMARY OF THE INVENTION

In accordance with the present invention, the above described problem of the prior art is minimized.

Briefly, the improvement is accomplished by mounting the major axis of the capillary essentially in the shape of a figure "8" as described above at an angle of about 45 degrees and preferably 45 degrees with respect to its direction of travel of the bond head. The capillary walls are sufficiently thick such that it will form a good stitch bond without fracturing when the major axis of the capillary makes an angle of from zero to about 45 degrees with the direction of travel of the bond head during the stitch bonding operation. In addition, the major axes of the two bond heads make an angle of about 90 degrees and preferably 90 degrees with respect to each other. This permits both bond heads to bond wires extending in both the x-direction and y direction, thereby permitting both bond heads to be operational for bond function for wires extending along the x or y axes as well as for bonding along either the x or y axes. Since the operation of the bond heads is preprogrammed, if any bond cannot be made in a satisfactory manner by one of the two bond heads, then the other bond head will be programmed to and be capable of making such bond. This results in a perfect x and y axis balancing, regardless of the shape of the package or the die being fabricated and allows for a one time set up and bond program generation from or in any bond head which also results in ease of set up and improved cycle time.

DESCRIPTION OF THE PREFERRED EMBODIMENT

Figure 1A:
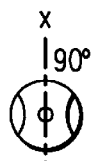
FIGS. 1a and 1b show the nose of two embodiments of the figure "8" capillary oriented at 90 degrees relative to the x-axis in accordance with the prior art.
Figure 1B:
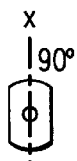
Figure 1C:
FIGS. 1c and 1d show the nose of two embodiments of the figure "8" capillary oriented at 0/180 degrees relative to the x-axis in accordance with the prior art.
Figure 1D:
Figure 2A:
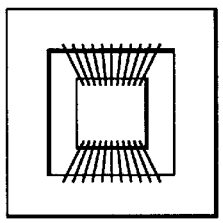
FIGS. 2a and 2b show bond wires from bond pads on a die where the number of wires parallel to the x-axis is approximately the same as the number of wires parallel to the y-axis in accordance with the prior art.
Figure 2B:
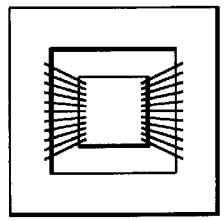
Figure 3A:
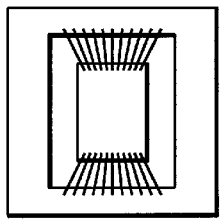
FIGS. 3a and 3b show bond wires from bond pads on a die where the number of wires parallel to the x-axis is greater than the number of wires parallel to the y-axis in accordance with the prior art.
Figure 3B:
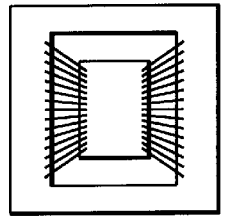

Referring first to FIGS. 1a and 1b, there are shown two embodiments of a figure "8" design of a capillary as viewed from the nose thereof oriented at 90 degrees relative to the x-axis and, in FIGS. 1c and 1d there are shown two embodiments of the capillary oriented at zero or 180 degrees relative to the x-axis, this being the standard prior art orientation in two headed bonders. With reference to FIGS. 2a and 2b which depict a square die, when the number of bonds in the x-direction and y-direction are about the same, the capillary of FIGS. 1a or 1b will make the bonds in FIG. 2a and the capillary of FIGS. 1c or 1d will make the bonds in FIG. 2b, with both capillaries making approximately the same number of bonds are operating for approximately the same time period. With reference to FIGS. 3a and 3b which depict a rectangular, non-square die, since the number of bonds in the x-direction is greater than the number of bonds in the y-direction, the capillary of FIGS. 1a or 1d must make many more bonds than does the capillary of FIGS. 1a or 1b, thereby causing the capillary of FIGS. 1a or 1b to be idle for a portion of the wire bonding operation while the capillary of FIGS. 1c or 1d completes its bonding operation.

Referring now to FIGS. 4a to 4d, there are shown capillaries the same as in FIGS. 1a to 1d respectively except that the capillaries have been rotated by 45 degrees with respect to the y axis as shown in FIGS. 1a and 1b with the angle between the major axes of the two capillaries in the bonder being about ninety degrees apart.

Figure 4A:
FIGS. 4a to 4d are the same as FIGS. 1a to 1d respectively except that the major axes are rotated by 45 degrees and remain at an angle of 90 degrees with respect to each other.
Figure 4B:
Figure 4C:
Figure 4D:
Figure 5A:
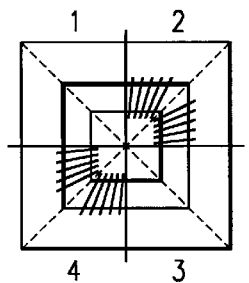
FIG. 5a shows the wires that would be bonded by the capillary of FIGS. 4a or 4b and FIG. 5b shows the wires that would be bonded by the capillary of FIGS. 4c and 4d.
Figure 5B:
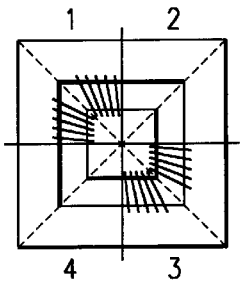

With reference to FIGS. 5a and 5b, FIG. 5a shows wires that could be bonded by the capillary of FIGS. 4a or 4b, this figure showing all of the wires in the second and fourth quadrants being bonded by that capillary. FIG. 5b shows wires that could be bonded by the capillary of FIGS. 4c or 4d. It is noted that all of these wires will be at an angle of about 45 degrees or less with respect to the major axis of the capillary during the stitch bonding procedure. It should be understood that the capillaries can be programmed to handle any of the wires to be bonded, it being efficient to restrict a capillary to a small area of travel, when possible, to increase productivity due to minimized travel time. However, where it is determined that a capillary is incapable of making a stitch bond in a particular location due to wire orientation, the other capillary will be programmed to handle that bond.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of bonding wire which comprises the steps of:

(a) providing a wire bonder for bonding wire to a bonding location having a first bonding head designed to form a stitch bond while travelling in a first predetermined direction, said first bonding head having a first major axis and a first minor axis normal to said first major axis, said first major axis being at an angle of from about 45 degrees to a finite angle greater than zero relative to said first predetermined direction and a second bonding head designed to form a stitch bond while travelling in a second predetermined direction, said second bonding head having a second major axis and a second minor axis normal to said second major axis, said second major axis being at an angle of from about 45 degrees to a finite angle greater than zero relative to said second predetermined direction;

(b) dividing an area having bonding locations to which said bonder is to make wire bonds into a plurality of regions;

(c) causing said first bonding head to make wire bonds in a predetermined one of said plurality of regions; and (d) causing said second bonding head to make wire bonds in a predetermined second one of said plurality of regions.

2. The method of claim 1 wherein said first major axis is at an angle of about 45 degrees with respect to said first predetermined direction and said second major axis is at an angle of about 45 degrees with respect to said second predetermined direction.

3. The method of claim 1 wherein said first predetermined direction is substantially normal to said second predetermined direction.

4. The method of claim 2 wherein said first predetermined direction is substantially normal to said second predetermined direction.

* * * * *